US010490951B2

(12) United States Patent
Chang et al.

(10) Patent No.: US 10,490,951 B2
(45) Date of Patent: Nov. 26, 2019

(54) ELECTRICAL CONNECTOR

(71) Applicant: LOTES CO., LTD, Keelung (TW)

(72) Inventors: Wen Chang Chang, Keelung (TW); Yong Fu Wang, Keelung (TW); Chang Wei Huang, Keelung (TW)

(73) Assignee: LOTES CO., LTD, Keelung (TW)

( * ) Notice: Subject to any disclaimer, the term of this patent is extended or adjusted under 35 U.S.C. 154(b) by 43 days.

(21) Appl. No.: 16/007,254

(22) Filed: Jun. 13, 2018

(65) Prior Publication Data

US 2018/0366881 A1 Dec. 20, 2018

(30) Foreign Application Priority Data

Jun. 16, 2017 (CN) .......................... 2017 1 0454474

(51) Int. Cl.
*H01R 13/6588* (2011.01)
*H01R 13/6597* (2011.01)
(Continued)

(52) U.S. Cl.
CPC ....... *H01R 13/6588* (2013.01); *H01R 12/716* (2013.01); *H01R 13/41* (2013.01); *H01R 13/6597* (2013.01); *H01R 13/2442* (2013.01)

(58) Field of Classification Search
CPC ............ H01R 13/6588; H01R 13/6597; H01R 13/2442; H01R 13/41; H01R 13/6581; H01R 13/02; H01R 13/40; H01R 13/502; H01R 13/646; H01R 12/57; H01R 12/714; H01R 12/716; H01R 13/7195;
(Continued)

(56) References Cited

U.S. PATENT DOCUMENTS 3,237,146 A * 2/1966 Barker ............... H01R 13/6588 439/607.12
4,362,350 A * 12/1982 von Harz ............ H01R 13/426 439/607.12

(Continued)

FOREIGN PATENT DOCUMENTS

| | | |
|---|---|---|
| CN | 202034567 U | 11/2011 |
| CN | 202930669 U | 5/2013 |
| CN | 103378492 B | 3/2016 |

*Primary Examiner* — Edwin A. Leon
*Assistant Examiner* — Milagros Jeancharles
(74) *Attorney, Agent, or Firm* — Locke Lord LLP; Tim Tingkang Xia, Esq.

(57) ABSTRACT

An electrical connector includes an insulating body, multiple terminals respectively correspondingly accommodated in the insulating body, and a shielding member provided on the insulating body. The terminals includes at least one grounding terminal and at least one signal terminal having identical structures. Each terminal includes a base, an elastic arm bending upward and extending from the base for being conductively connected with a chip module, and at least one strip connecting portion formed by extending upward from the base for being connected with a strip. The shielding member is provided with multiple holes for the grounding terminal and the signal terminal to pass therethrough, and at least one abutting portion corresponding to the strip connecting portion of the grounding terminal and protrudingly extending toward at least one of the holes so as to be in contact with the strip connecting portion of the grounding terminal.

20 Claims, 8 Drawing Sheets

100 2A 22 231 26 232 21 23 27 27 24 25 2B 2 2A 11 111 1 3 2A 26 27 24 23 25 6 27 24 23 311 2B 6

(51) Int. Cl.
*H01R 12/71* (2011.01)
*H01R 13/41* (2006.01)
*H01R 13/24* (2006.01)

(58) Field of Classification Search
CPC .............. H01R 13/7197; H01R 13/658; H01R 23/6873; H05K 7/1069
See application file for complete search history.

(56) References Cited

U.S. PATENT DOCUMENTS 4,371,226 A * 2/1983 Brancaleone .......... H01G 4/228 29/854
4,582,385 A * 4/1986 Couper .............. H01R 13/7195 439/607.12
4,875,865 A * 10/1989 Demler, Jr. .......... H01R 12/716 439/101
5,057,041 A * 10/1991 Yu ...................... H01R 13/7195 29/842
5,586,912 A * 12/1996 Eslampour ......... H01R 13/7197 439/620.22
7,131,850 B2 * 11/2006 Frutschy .............. H05K 7/1061 439/71
7,147,489 B1 * 12/2006 Lin ........................ H01R 12/57 439/83
7,467,949 B2 * 12/2008 Liao ................... H01R 13/2435 439/66
8,167,652 B1 * 5/2012 Ju ........................ H01R 12/714 29/592.1
8,192,206 B1 * 6/2012 Ju .......................... H01R 12/57 439/66
8,215,998 B1 * 7/2012 Ju ...................... H01R 12/7076 439/626
8,360,790 B2 * 1/2013 Ju ........................ H01R 12/716 439/66
8,414,311 B2 * 4/2013 Ju .......................... H01R 12/89 439/83
8,430,682 B2 * 4/2013 Liao ....................... H01R 12/57 439/342
8,641,449 B2 * 2/2014 Cai .................... H01R 13/6581 439/515
8,708,716 B1 * 4/2014 Ho ....................... H01R 12/714 439/83
8,932,080 B2 * 1/2015 Chang .................. H05K 7/1069 439/607.1
9,106,022 B2 * 8/2015 Cai .................... H01R 13/6471
9,178,322 B2 * 11/2015 Chang ................ H01R 13/6594
9,450,313 B2 * 9/2016 Tsai ....................... H01R 4/027
9,472,887 B1 * 10/2016 Horning ............... H01R 13/502
9,954,312 B1 * 4/2018 Ju ........................ H01R 12/707
10,172,249 B1 * 1/2019 Ju ...................... H01R 12/7082
10,230,177 B2 * 3/2019 Ju ...................... H01R 13/2442
2006/0040518 A1 * 2/2006 Ma ..................... H01R 13/2442 439/66
2006/0094263 A1 * 5/2006 Chen .................. H01R 13/2442 439/66
2007/0015376 A1 * 1/2007 Szu .................... H01R 13/2442 439/66
2007/0148998 A1 * 6/2007 Liao ....................... H01R 12/57 439/66
2011/0076862 A1 * 3/2011 Yeh .................... H01R 13/2457 439/70
2012/0028502 A1 * 2/2012 Yeh ........................ H01R 12/57 439/626
2012/0196481 A1 * 8/2012 Ju ...................... H01R 13/6588 439/626
2013/0237091 A1 * 9/2013 Mason ............... H01R 13/6585 439/607.05
2014/0322974 A1 * 10/2014 Chang ................ H01R 13/6585 439/607.01
2015/0056857 A1 * 2/2015 Chang ................ H01R 13/6588 439/607.09

* cited by examiner

ELECTRICAL CONNECTOR

CROSS-REFERENCE TO RELATED PATENT APPLICATION

This non-provisional application claims priority to and the benefit of, pursuant to 35 U.S.C. § 119(a), patent application Serial No. CN201710454474.7 filed in China on Jun. 16, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present invention relates to an electrical connector, and more particularly to an electrical connector which can prevent electromagnetic interference among signal terminals.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector includes an insulating body, multiple signal terminals, a grounding member and a shielding member. The insulating body is provided with multiple accommodating tubes, and each signal terminal is correspondingly accommodated in one accommodating tube. The shielding member is provided in the insulating body, and multiple shielding holes are formed in the shielding member. Each shielding hole correspondingly surrounds one accommodating tube. The accommodating tube where the grounding member is located is provided with a notch, and the grounding member has an extending portion protruding from the notch, such that a plate edge of the extending portion is electrically connected with an inner wall of each shielding hole in the shielding member, so as to facilitate a shielding effect among the signal terminals, and prevent from interference during signal transmission. However, in order to prevent the signal terminals from abutting the shielding member to cause short-circuiting, the signal terminals are not provided with extending portions abutting the shielding member, such that the structure of each signal terminal is different from that of the grounding member. In practical production, this increases the processing difficulty of the signal terminals and the grounding member. Further, during assembly, an operator may easily assemble the signal terminals in the accommodating tube where the grounding member is located by mistake, so as to cause failure to abut the shielding member, which affects the shielding effect of the electrical connector and weakens the anti-interference ability during signal transmission.

Therefore, a heretofore unaddressed need to design a novel electrical connector exists in the art to address the aforementioned deficiencies and inadequacies.

SUMMARY

The invention is directed to an electrical connector which can prevent electromagnetic interference among signal terminals.

To achieve the foregoing objective, the present invention adopts the following technical solutions:

An electrical connector includes: an insulating body; a plurality of terminals, respectively correspondingly accommodated in the insulating body, and comprising at least one grounding terminal and at least one signal terminal having identical structures, wherein each of the terminals comprises a base, an elastic arm bending upward and extending from the base, and at least one strip connecting portion formed by extending upward from the base, wherein the elastic arm is configured to be conductively connected with a chip module, and the strip connecting portion is configured to be connected with a strip; and a shielding member, provided on the insulating body, wherein the shielding member is provided with a plurality of holes for the at least one grounding terminal and the at least one signal terminal to pass therethrough, and the shielding member is provided with at least one abutting portion corresponding to the at least one strip connecting portion of the at least one grounding terminal and protrudingly extending toward at least one of the holes so as to be in contact with the at least one strip connecting portion of the at least one grounding terminal.

In certain embodiments, the abutting portion is in contact with a plate edge at one side of the strip connecting portion, and a first gap is formed between a plate edge at an opposite other side of the strip connecting portion and the elastic arm.

In certain embodiments, the plate edge at the one side of the strip connecting portion is horizontally protrudingly provided with an extending portion located above the corresponding abutting portion.

In certain embodiments, the base extends downward to form a soldering portion and two fastening portions located at two opposite sides of the soldering portion, the soldering portion is configured to be soldered to a circuit board, the fastening portions are fastened to the insulating body, a second gap is formed between each of the fastening portions and the soldering portion, two strip connecting portions are provided and located at two opposite sides of the elastic arm, and the fastening portions, the soldering portion, the base and the strip connecting portions are located on a same vertical plane.

In certain embodiments, the insulating body is protrudingly provided with two supporting portions at two opposite sides of the strip connecting portion and configured to support the chip module, and the strip connecting portion is clamped between the two supporting portions.

In certain embodiments, the two supporting portions have two guiding oblique surfaces facing each other, and a top end of the strip connecting portion is higher than a lower end of each of the guiding oblique surfaces but lower than an upper end of each of the guiding oblique surfaces.

In certain embodiments, the two opposite sides of the strip connecting portion are concavely provided with two concave portions extending to the top end of the strip connecting portion, and the concave portions face the guiding oblique surfaces.

In certain embodiments, the shielding member is at least partially embeddedly provided at a bottom end of one of the two supporting portions.

In certain embodiments, a free end of the abutting portion is embeddedly provided at a bottom end of one of the two supporting portions.

In certain embodiments, each of the holes is provided with a plurality of protruding portions, each of the protruding portions is embeddedly provided at a bottom end of one of the two supporting portions, and the abutting portion is located between two of the protruding portions.

Compared with the related art, certain embodiments of the invention have the following beneficial effects:

The abutting portion is protrudingly provided on the shielding member instead of the grounding terminal, thereby ensuring that the grounding terminal and the signal terminal have identical structures, and reducing the processing difficulty of the grounding terminal and the signal terminal. Meanwhile, an operator no longer needs to distinguish the positions of the grounding terminal and the signal terminal during assembly, thus reducing the assembling difficulty of the grounding terminal and the signal terminal, and avoiding the situation that the signal terminal is assembled at the position of the grounding terminal by mistake to cause the grounding terminal not to be in contact with the shielding member, and thereby ensuring the shielding effect of the electrical connector and enhancing the anti-interference ability during signal transmission.

To achieve the foregoing objective, the present invention also adopts the following technical solutions:

An electrical connector includes: an insulating body; a plurality of terminals, respectively correspondingly accommodated in the insulating body, and comprising at least one grounding terminal and at least one signal terminal having identical structures, wherein each of the terminals comprises a base, an elastic arm bending upward and extending from the base, and at least one strip connecting portion formed by extending upward from the base, wherein the elastic arm is configured to be conductively connected with an electronic component, and the strip connecting portion is configured to be connected with a strip; and a shielding member, provided on the insulating body, wherein the shielding member is provided with a plurality of holes for the at least one grounding terminal and the at least one signal terminal to pass therethrough, and the shielding member is provided with at least one abutting portion corresponding to the at least one strip connecting portion of the at least one grounding terminal and protrudingly extending toward at least one of the holes so as to be in contact with the at least one strip connecting portion of the at least one grounding terminal.

In certain embodiments, two strip connecting portions are provided at two opposite sides of the elastic arm, and each of the holes is provided with two abutting portions protruding towards each other and being in contact with the two connecting portions correspondingly.

In certain embodiments, the abutting portion is in contact with a plate edge at one side of the strip connecting portion.

In certain embodiments, the plate edge of the strip connecting portion is horizontally protrudingly provided with an extending portion located above the corresponding abutting portion.

In certain embodiments, the base extends downward to form a soldering portion and a fastening portion located at one side of the soldering portion, the soldering portion is configured to be soldered to a circuit board, the fastening portion is fastened to the insulating body, a gap is formed between the fastening portion and the soldering portion, and the fastening portion, the soldering portion, the base and the strip connecting portion are located on a same vertical plane.

In certain embodiments, the insulating body is protrudingly provided with two supporting portions at two opposite sides of the strip connecting portion and configured to support the electronic component, and the strip connecting portion is clamped between the two supporting portions.

In certain embodiments, the two supporting portions have two guiding oblique surfaces facing each other, and a top end of the strip connecting portion is higher than a lower end of each of the guiding oblique surfaces but lower than an upper end of each of the guiding oblique surfaces.

In certain embodiments, the two opposite sides of the strip connecting portion are concavely provided with two concave portions extending to the top end of the strip connecting portion, and the concave portions face the guiding oblique surfaces.

In certain embodiments, the abutting portion is at least partially embeddedly provided in one of the two supporting portions.

In certain embodiments, each of the holes is provided with a plurality of protruding portions, each of the protruding portions is embeddedly provided in one of the two supporting portions, and the abutting portion is located between two of the protruding portions.

Compared with the related art, certain embodiments of the invention have the following beneficial effects:

The abutting portion is protrudingly provided on the shielding member instead of the grounding terminal, thereby ensuring that the grounding terminal and the signal terminal have identical structures, and reducing the processing difficulty of the grounding terminal and the signal terminal. Meanwhile, an operator no longer needs to distinguish the positions of the grounding terminal and the signal terminal during assembly, thus reducing the assembling difficulty of the grounding terminal and the signal terminal, and avoiding the situation that the signal terminal is assembled at the position of the grounding terminal by mistake to cause the grounding terminal not to be in contact with the shielding member, and thereby ensuring the shielding effect of the electrical connector and enhancing the anti-interference ability during signal transmission.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

Figure 1:
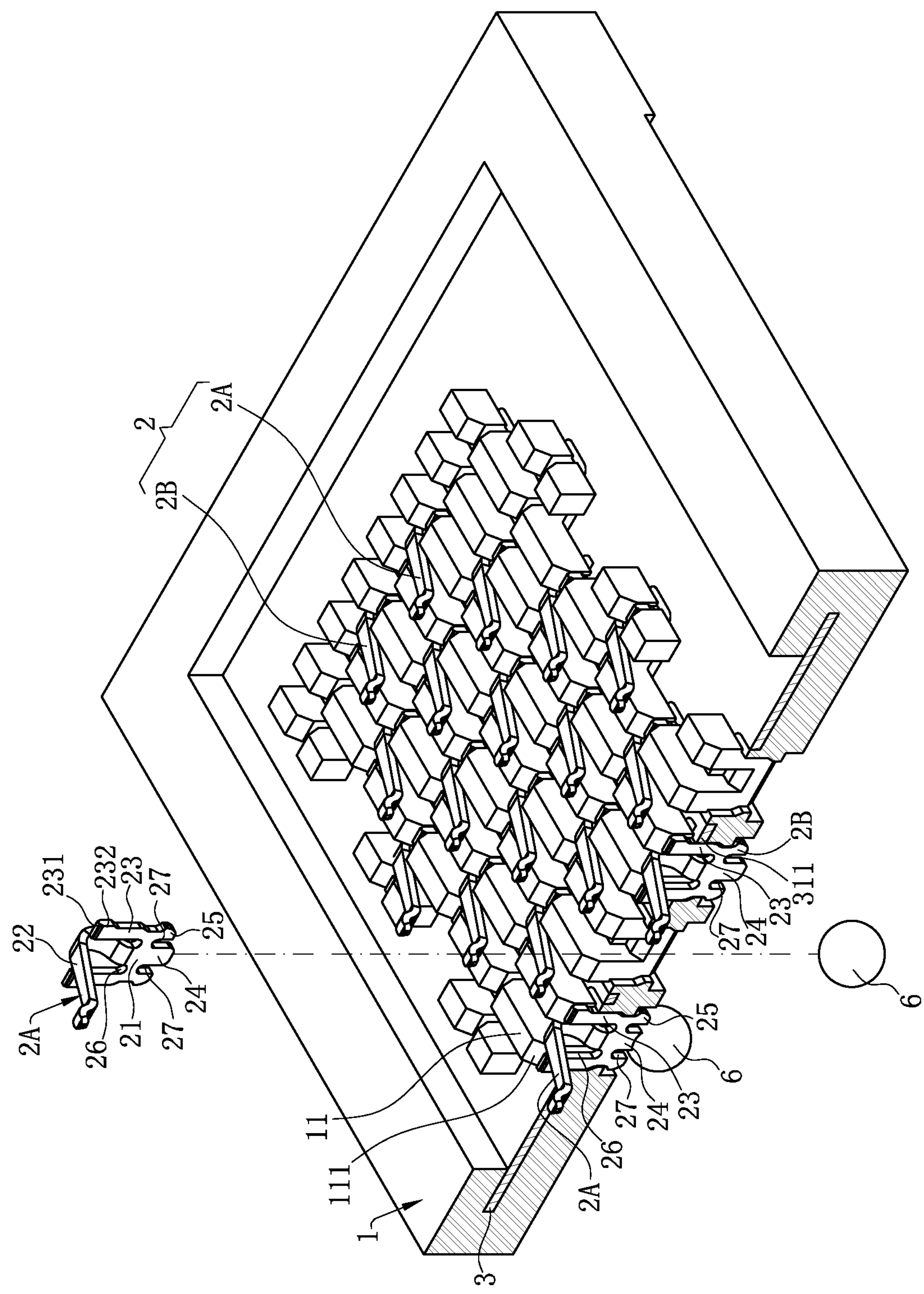
FIG. 1 is a perspective sectional view of an electrical connector according to certain embodiments of the present invention along a first angle.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-8. In accordance with the purposes of this invention, as embodied and broadly described herein, this invention, in one aspect, relates to an electrical connector.

Figure 3:
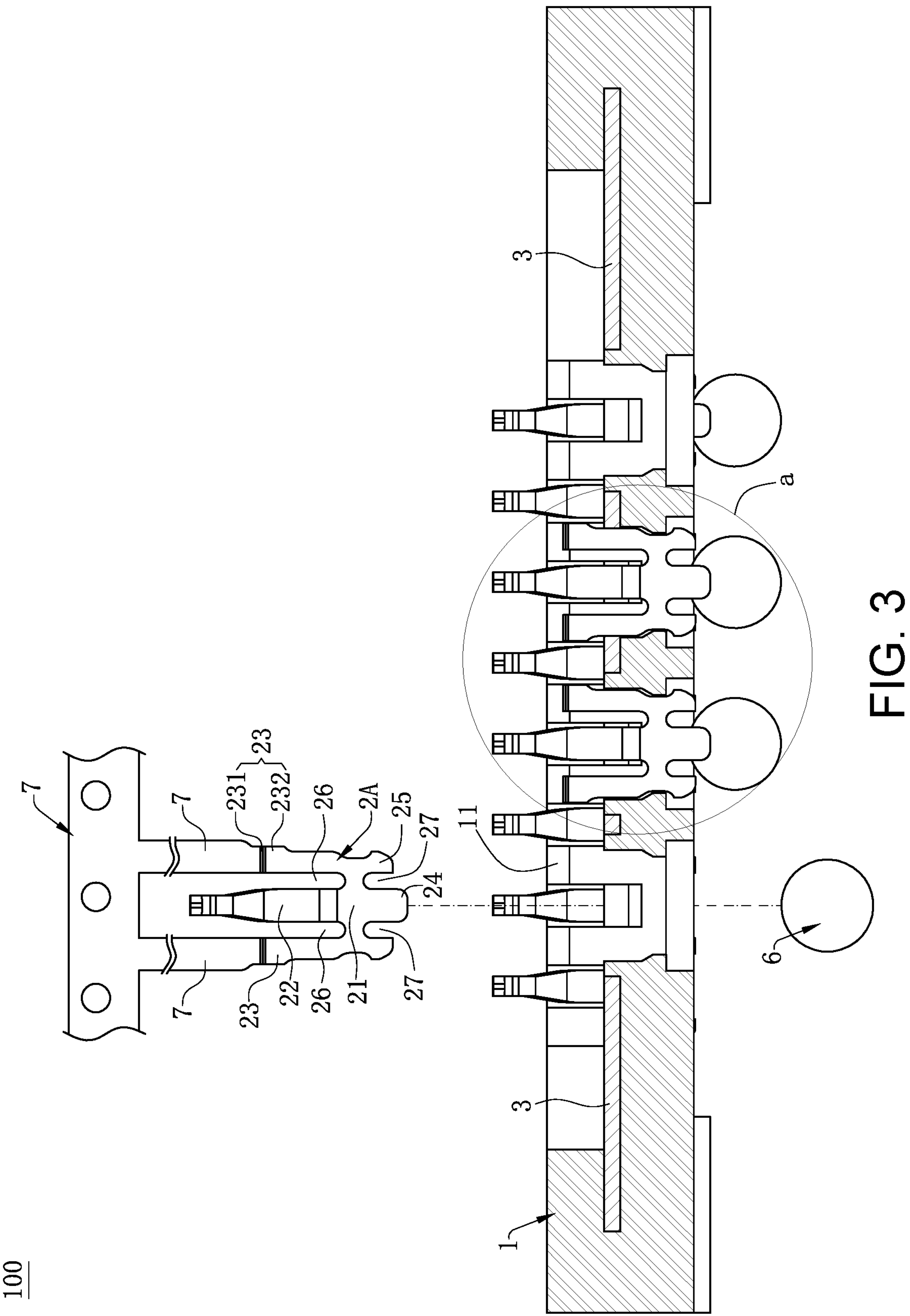
FIG. 3 is a front view of the electrical connector in FIG. 1.
Figure 7:
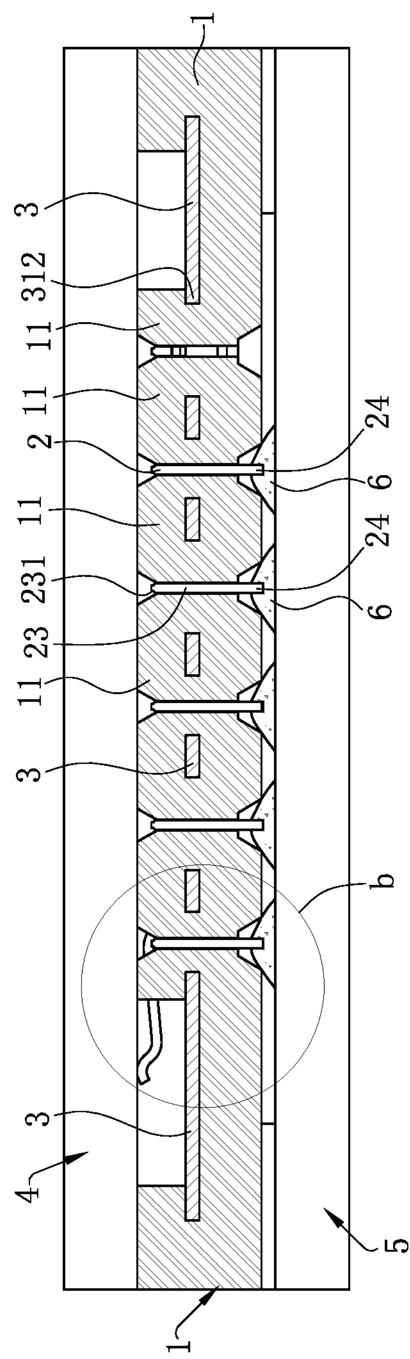
FIG. 7 is a side view of the electrical connector in FIG. 6 after a chip module is pressed downward.

As shown in FIG. 1, FIG. 3 and FIG. 7, an electrical connector 100 according to certain embodiments of the present invention is configured to electrically connect an electronic component 4 to a circuit board 5. The electrical connector 100 includes: an insulating body 1; a plurality of terminals 2 correspondingly accommodated in the insulating body 1, and including multiple signal terminals 2A for contacting multiple signal pads of the electronic component 4 to transmit signals, and multiple grounding terminals 2B for contacting multiple grounding pads of the electronic component 4 to achieve grounding, where the signal terminals 2A and the grounding terminals 2B having identical structures; and a shielding member 3 provided on the insulating body 1, where the shielding member 3 is only in contact with the grounding terminals 2B, but not the signal terminals 2A.

As shown in FIG. 1, in the present embodiment, there are multiple signal terminals 2A and multiple grounding terminals 2B. In other embodiments, there may be only one signal terminal 2A, or there may be only one grounding terminal 2B. Alternatively, there may be only one signal terminal 2A and only one grounding terminal 2B.

Figure 6:
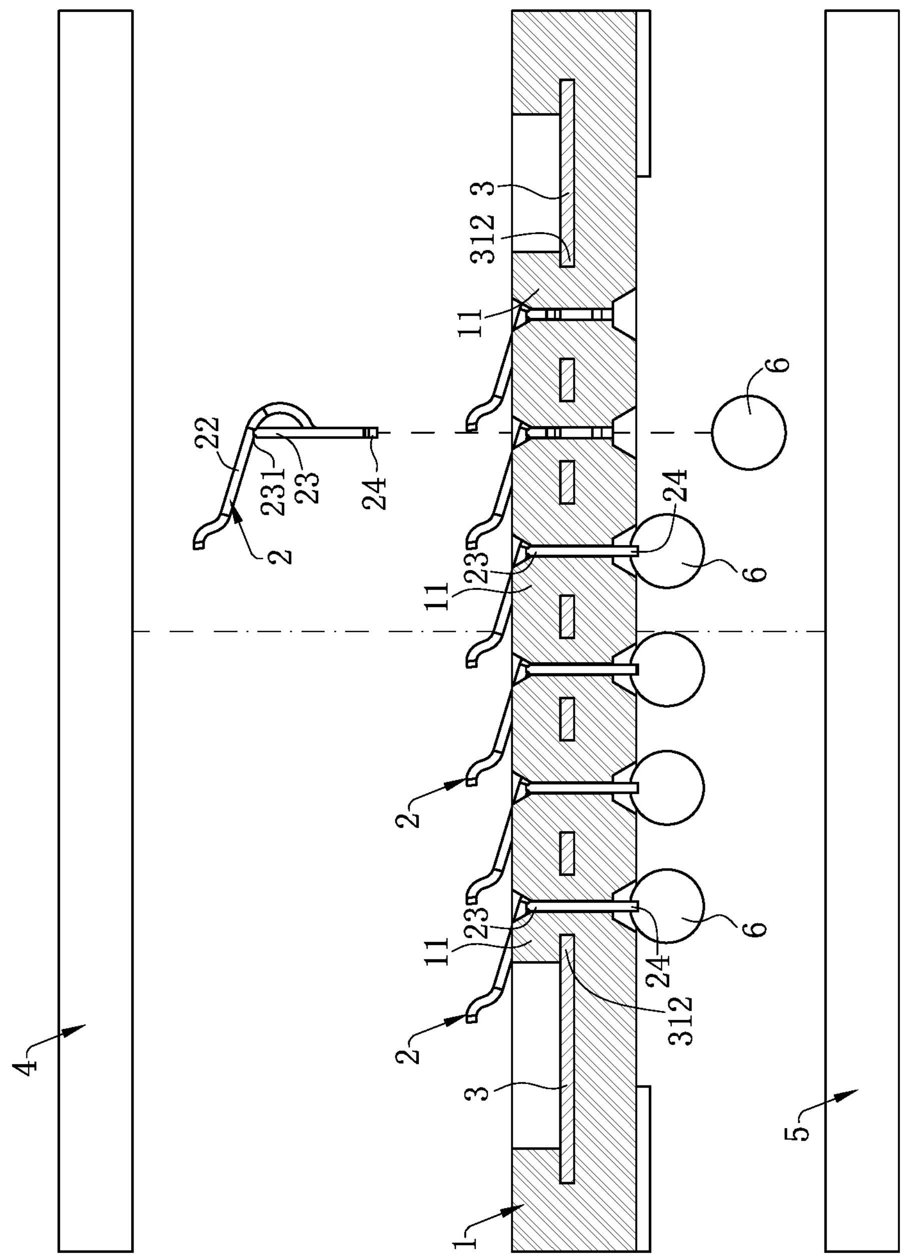
FIG. 6 is a side view of the electrical connector in FIG. 5 before a chip module is pressed downward.

As shown in FIG. 6, the electronic component 4 is a chip module. In other embodiments, the electronic component 4 may also be a mating connector which mates with the electrical connector 100.

Figure 4:
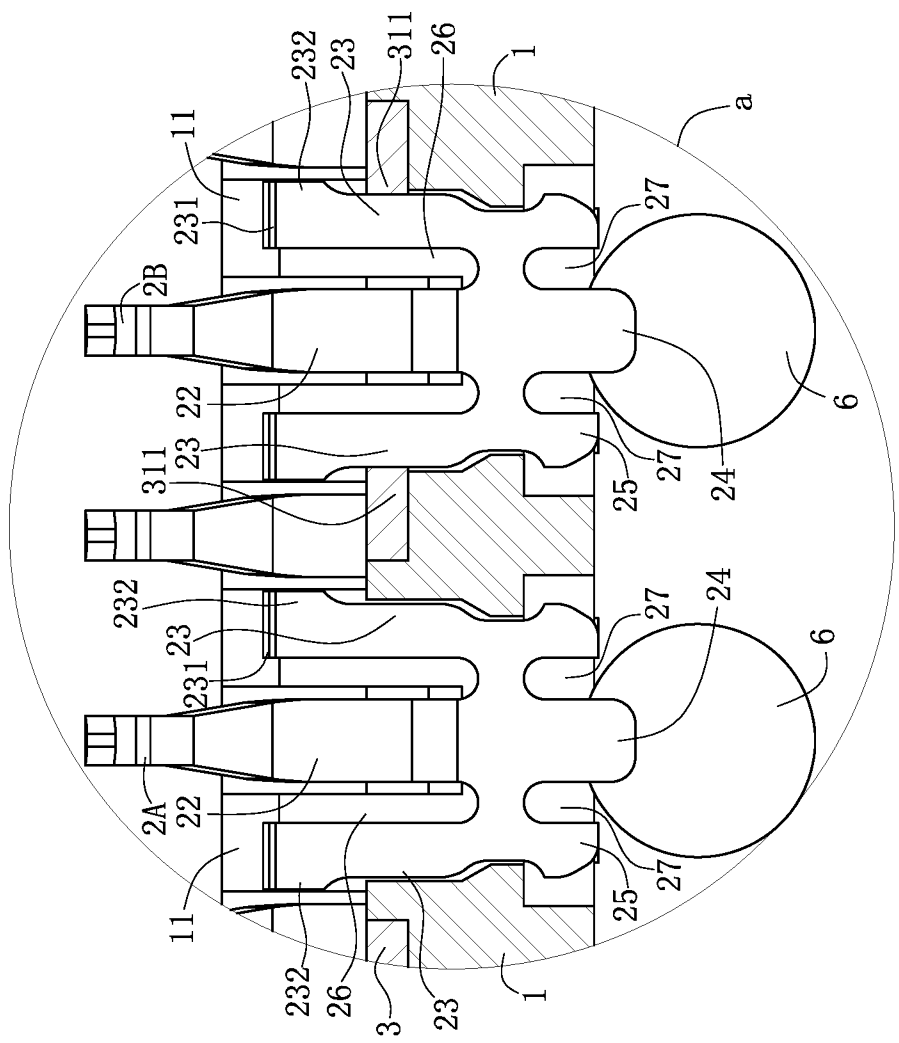
FIG. 4 is an enlarged view of part a in FIG. 3.

As shown in FIG. 1, FIG. 3 and FIG. 4, each terminal 2 has a base 21 being flat plate shaped; an elastic arm 22 bending upward and extending from the base 21, where the elastic arm 22 is configured to be conductively connected with the electronic component 4; and two strip connecting portions 23 extending upward from the base 21 and located at two opposite sides of the elastic arm 22, where the strip connecting portions 23 are configured to be connected with a strip 7.

In other embodiments, each terminal 2 may be provided with only one strip connecting portion 23, and the strip connecting portion 23 may be located at one side of the elastic arm 22.

A first gap 26 is formed between each strip connecting portion 23 and the elastic arm 22 such that the strip connecting portions 23 have certain elasticity. Each of the two opposite sides of each strip connecting portion 23 is concavely provided with a concave portion 231 extending to a top end of each connecting portion 23, so as to reduce the thickness of the strip connecting portions 23, and further facilitate the breakage of the strip 7. An extending portion 232 horizontally protrudes from a plate edge of each strip connecting portion 23, and the extending portion 232 can enhance the strength of the strip connecting portions 23, thus preventing other portions of the strip connecting portions 23, except for a breakage surface thereof, from being broken while the strip 7 is broken.

A soldering portion 24 is formed by extending downward from the base 21. The soldering portion 24 is soldered to the circuit board 5 through a solder ball 6. Two fastening portions 25 are formed by extending downward from the base 21 and are located at two opposite sides of the soldering portion 24, and the fastening portions 25 are fastened to the insulating body 1. A second gap 27 is formed between each fastening portion 25 and the soldering portion 24, such that the fastening portions 25 have certain elasticity.

In other embodiments, each terminal 2 may be provided with only one fastening portion 25, and the fastening portion 25 is located at one side of the soldering portion 24.

Figure 5:
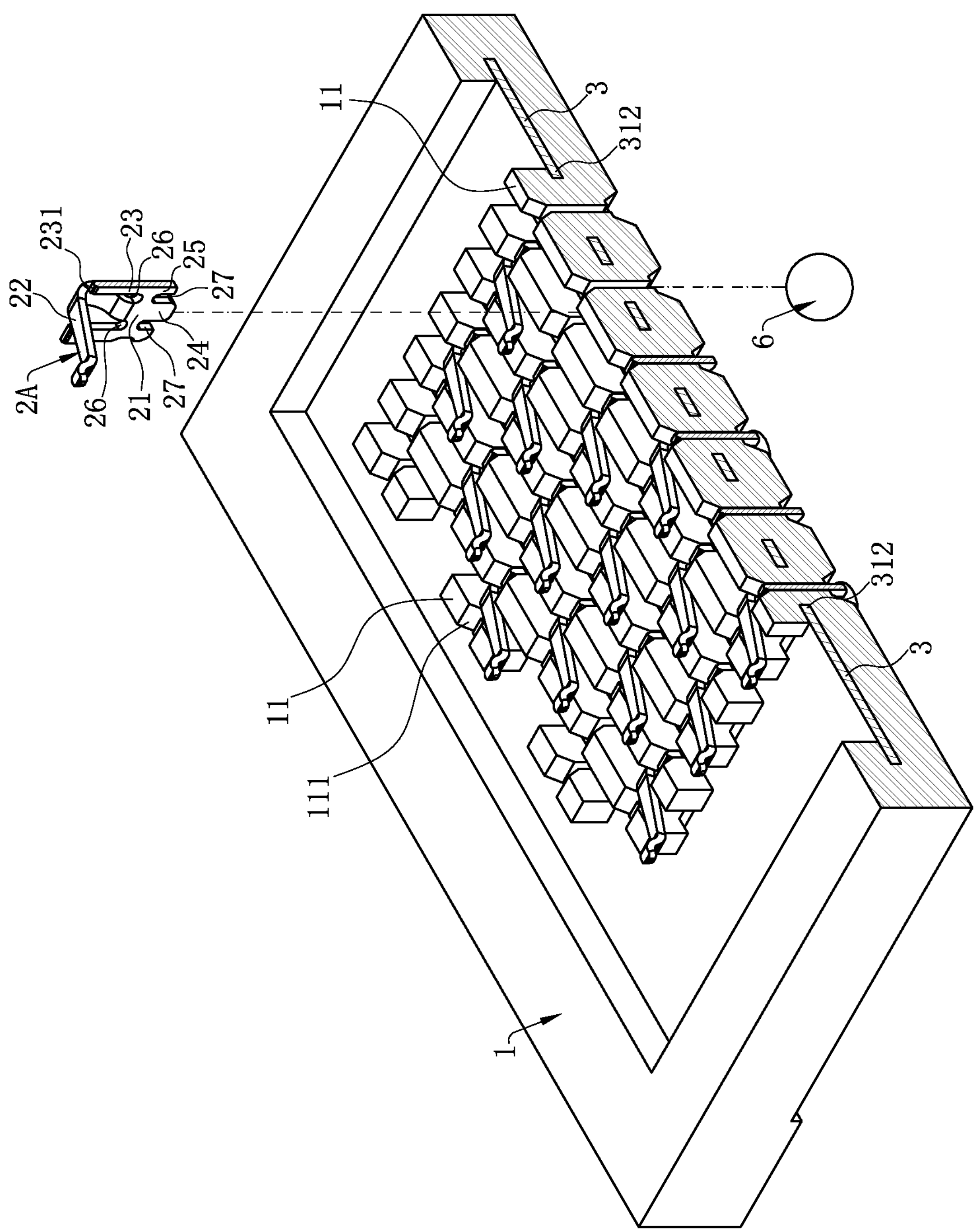
FIG. 5 is a perspective section view of the electrical connector according to certain embodiments of the present invention along a second angle.

As shown in FIG. 5 and FIG. 6, the fastening portions 25, the soldering portion 24, the base 21 and the strip connecting portions 23 are located on a same vertical plane, which facilitates the processing of the terminals 2 and reduces the space occupied by the terminals 2.

Figure 8:
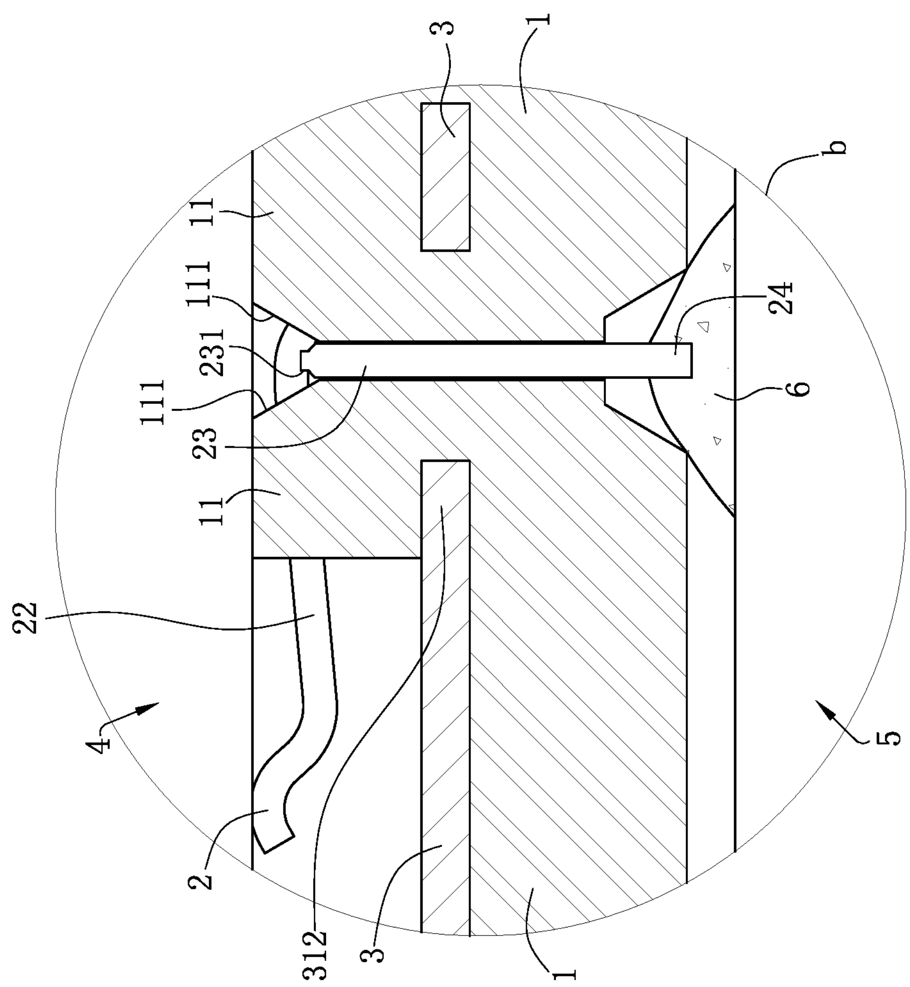
FIG. 8 is an enlarged view of part b in FIG. 7.

As shown in FIG. 1, FIG. 5 and FIG. 8, the insulating body 1 is protrudingly provided with two supporting portions 11 at two opposite sides of each strip connecting portion 23 and configured to support the electronic component 4. Each connecting portion 23 is clamped between the two supporting portions 11 to enhance the fastening effect of the terminals 2. The two supporting portions 11 include two guiding oblique surfaces 111 facing each other. A top end of each strip connecting portion 23 is higher than a lower end of each guiding oblique surface 111 but lower than an upper end of each guiding oblique surface 111, and the concave portions 231 face the guiding oblique surfaces 111 so as to provide the space for breaking the strip 7.

Figure 2:
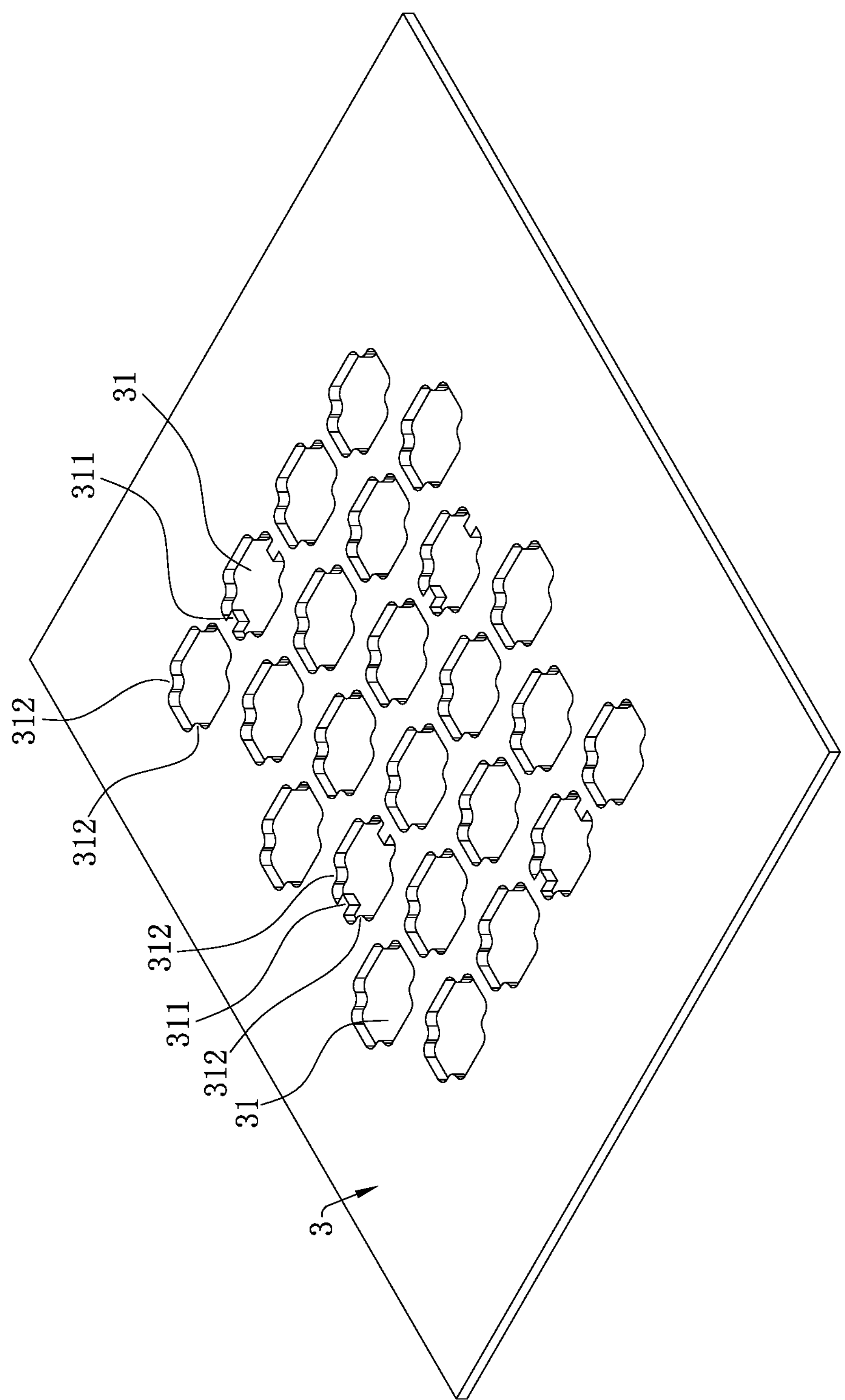
FIG. 2 is a perspective view of a shielding member in FIG. 1.

As shown in FIG. 1, FIG. 2 and FIG. 5, the shielding member 3 is made of a metal plate, and the shielding member 3 is partially embedded in the bottom end of each supporting portion 11, so as to be fixed to the insulating body 1.

In other embodiments, the shielding member 3 may also be a metal plating layer plated on the insulating body 1.

As shown in FIG. 2 and FIG. 4, the shielding member 3 is provided with a plurality of holes 31 for the grounding terminals 2B and the signal terminals 2A to pass therethrough. The shielding member 3 extends horizontally from each hole 31 toward each connecting portion 23 of each grounding terminal 2B to form an abutting portion 311, so as to contact the plate edge of the strip connecting portion 23 of each grounding terminal 2B.

As shown in FIG. 1, FIG. 2 and FIG. 4, each abutting portion 311 is located directly below the corresponding extending portion 232, and a free end of each abutting portion 311 is embedded at a bottom end of the corresponding supporting portion 11, thus enhancing the fixing effect of the abutting portions 311, and avoiding damage to the abutting portions 311 due to external collision.

In other embodiments, each abutting portion 311 may be entirely embedded at the bottom end of the corresponding supporting portion 11.

Each hole 31 is provided with a plurality of protruding portions 312. Each protruding portion 312 is embedded in the bottom end of the corresponding supporting portion 11, and each abutting portion 311 is located between two corresponding protruding portions 312, so as to enhance the fixing effect of the shielding member 3.

As shown in FIG. 1, FIG. 6 and FIG. 7, during assembly, the shielding member 3 is firstly embedded at the bottom end of the corresponding supporting portions 11. Then, the terminals 2 are fixed to the insulating body 1 respectively until each abutting portion 311 is in contact with the plate edge of the corresponding connecting portion 23 of the corresponding grounding terminal 2B. Next, the electrical connector 100 is placed on the circuit board 5, and the electrical connector 100 is soldered to the circuit board 5 by the solder ball 6. Then, the electronic component 4 is mounted on the electrical connector 100, and a downward force is applied to the electronic component 4 such that the electronic component 4 downward abuts the terminals 2 until the supporting portions 11 support the electronic component 4, thus preventing the electronic component 4 from being crushed, and preventing the terminals 2 being excessively deformed when being pressed.

To sum up, the electrical connector according to certain embodiments of the present invention has the following beneficial effects:

(1) The abutting portions 311 are protrudingly provided on the shielding member 3 instead of the grounding terminals 2B, thereby ensuring that the grounding terminals 2B and the signal terminals 2A have identical structures, and reducing the processing difficulty of the grounding terminals 2B and the signal terminals 2A. Meanwhile, an operator no longer needs to distinguish the positions of the grounding terminals 2B and the signal terminals 2A during assembly, thus reducing the assembling difficulty of the grounding terminals 2B and the signal terminals 2A, and avoiding the situation that the signal terminals 2A are assembled at the position of the grounding terminals 2B by mistake to cause the grounding terminals 2B not to be in contact with the shielding member 3, and thereby ensuring the shielding effect of the electrical connector 100 and enhancing the anti-interference ability during signal transmission.

(2) Each strip connecting portion 23 is clamped between the two corresponding supporting portions 11 to enhance the fastening effect of the strip connecting portions 23.

(3) The two supporting portions 11 include two guiding oblique surfaces 111 facing each other, and the top end of each strip connecting portion 23 is higher than the lower end of each guiding oblique surface 111 but lower than the upper end of each guiding oblique surface 111, so as to provide the space for breaking the strip 7.

(4) The free end of each abutting portion 311 is embedded at the bottom end of the corresponding supporting portion 11 to enhance the fixing effect of the abutting portion 311 and prevent the abutting portion 311 from being damaged by external collision.

(5) Each abutting portion 311 is in contact with a plate edge of one side of the corresponding strip connecting portion 23, and a first gap 26 is formed between a plate edge of the other opposite side of the strip connecting portion 23 and the corresponding elastic arm 22. Thus, the elasticity of each strip connecting portion 23 toward the corresponding abutting portion 311 is good, thus ensuring good contact between the strip connecting portions 23 and the shielding member 3.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, comprising:

an insulating body;

a plurality of terminals, respectively correspondingly accommodated in the insulating body, and comprising at least one grounding terminal and at least one signal terminal having identical structures, wherein each of the terminals comprises a base, an elastic arm bending upward and extending from the base, and at least one strip connecting portion formed by extending upward from the base, wherein the elastic arm is configured to be conductively connected with a chip module, and the strip connecting portion is configured to be connected with a strip; and a shielding member, provided on the insulating body, wherein the shielding member is provided with a plurality of holes for the at least one grounding terminal and the at least one signal terminal to pass therethrough, and the shielding member is provided with at least one abutting portion corresponding to the at least one strip connecting portion of the at least one grounding terminal and protrudingly extending toward at least one of the holes so as to be in contact with the at least one strip connecting portion of the at least one grounding terminal.

2. The electrical connector according to claim 1, wherein the abutting portion is in contact with a plate edge at one side of the strip connecting portion, and a first gap is formed between a plate edge at an opposite other side of the strip connecting portion and the elastic arm.

3. The electrical connector according to claim 2, wherein the plate edge at the one side of the strip connecting portion is horizontally protrudingly provided with an extending portion located above the corresponding abutting portion.

4. The electrical connector according to claim 1, wherein the base extends downward to form a soldering portion and two fastening portions located at two opposite sides of the soldering portion, the soldering portion is configured to be soldered to a circuit board, the fastening portions are fastened to the insulating body, a second gap is formed between each of the fastening portions and the soldering portion, two strip connecting portions are provided and located at two opposite sides of the elastic arm, and the fastening portions, the soldering portion, the base and the strip connecting portions are located on a same vertical plane.

5. The electrical connector according to claim 1, wherein the insulating body is protrudingly provided with two supporting portions at two opposite sides of the strip connecting portion and configured to support the chip module, and the strip connecting portion is clamped between the two supporting portions.

6. The electrical connector according to claim 5, wherein the two supporting portions have two guiding oblique surfaces facing each other, and a top end of the strip connecting portion is higher than a lower end of each of the guiding oblique surfaces but lower than an upper end of each of the guiding oblique surfaces.

7. The electrical connector according to claim 6, wherein the two opposite sides of the strip connecting portion are concavely provided with two concave portions extending to the top end of the strip connecting portion, and the concave portions face the guiding oblique surfaces.

8. The electrical connector according to claim 5, wherein the shielding member is at least partially embeddedly provided at a bottom end of one of the two supporting portions.

9. The electrical connector according to claim 5, wherein a free end of the abutting portion is embeddedly provided at a bottom end of one of the two supporting portions.

10. The electrical connector according to claim 5, wherein each of the holes is provided with a plurality of protruding portions, each of the protruding portions is embeddedly provided at a bottom end of one of the two supporting portions, and the abutting portion is located between two of the protruding portions.

11. An electrical connector, comprising:

an insulating body;

a plurality of terminals, respectively correspondingly accommodated in the insulating body, and comprising at least one grounding terminal and at least one signal terminal having identical structures, wherein each of the terminals comprises a base, an elastic arm bending upward and extending from the base, and at least one strip connecting portion formed by extending upward from the base, wherein the elastic arm is configured to be conductively connected with an electronic component, and the strip connecting portion is configured to be connected with a strip; and a shielding member, provided on the insulating body, wherein the shielding member is provided with a plurality of holes for the at least one grounding terminal and the at least one signal terminal to pass therethrough, and the shielding member is provided with at least one abutting portion corresponding to the at least one strip connecting portion of the at least one grounding terminal and protrudingly extending toward at least one of the holes so as to be in contact with the at least one strip connecting portion of the at least one grounding terminal.

12. The electrical connector according to claim 11, wherein two strip connecting portions are provided at two opposite sides of the elastic arm, and each of the holes is provided with two abutting portions protruding towards each other and being in contact with the two connecting portions correspondingly.

13. The electrical connector according to claim 11, wherein the abutting portion is in contact with a plate edge at one side of the strip connecting portion.

14. The electrical connector according to claim 13, wherein the plate edge of the strip connecting portion is horizontally protrudingly provided with an extending portion located above the corresponding abutting portion.

15. The electrical connector according to claim 11, wherein the base extends downward to form a soldering portion and a fastening portion located at one side of the soldering portion, the soldering portion is configured to be soldered to a circuit board, the fastening portion is fastened to the insulating body, a gap is formed between the fastening portion and the soldering portion, and the fastening portion, the soldering portion, the base and the strip connecting portion are located on a same vertical plane.

16. The electrical connector according to claim 11, wherein the insulating body is protrudingly provided with two supporting portions at two opposite sides of the strip connecting portion and configured to support the electronic component, and the strip connecting portion is clamped between the two supporting portions.

17. The electrical connector according to claim 16, wherein the two supporting portions have two guiding oblique surfaces facing each other, and a top end of the strip connecting portion is higher than a lower end of each of the guiding oblique surfaces but lower than an upper end of each of the guiding oblique surfaces.

18. The electrical connector according to claim 16, wherein the two opposite sides of the strip connecting portion are concavely provided with two concave portions extending to the top end of the strip connecting portion, and the concave portions face the guiding oblique surfaces.

19. The electrical connector according to claim 16, wherein the abutting portion is at least partially embeddedly provided in one of the two supporting portions.

20. The electrical connector according to claim 16, wherein each of the holes is provided with a plurality of protruding portions, each of the protruding portions is embeddedly provided in one of the two supporting portions, and the abutting portion is located between two of the protruding portions.

* * * * *